(12) United States Patent
He et al.

(10) Patent No.: US 9,963,551 B2
(45) Date of Patent: May 8, 2018

(54) CURABLE ORGANOPOLYSILOXANE COMPOSITION AND SEMICONDUCTOR DEVICE

(71) Applicant: GUANGZHOU HUMAN CHEM CO., LTD., Guangzhou (CN)

(72) Inventors: Hai He, Guangzhou (CN); Wang Chen, Guangzhou (CN); Haiting Zheng, Guangzhou (CN); Jingwei Zhu, Guangzhou (CN); Guangyan Huang, Guangzhou (CN)

(73) Assignee: GUANGZHOU HUMAN CHEM CO., LTD., Guangzhou (CN)

( * ) Notice: Subject to any disclaimer, the term of this patent is extended or adjusted under 35 U.S.C. 154(b) by 34 days.

(21) Appl. No.: 15/318,519

(22) PCT Filed: Jan. 23, 2015

(86) PCT No.: PCT/CN2015/071379
§ 371 (c)(1),
(2) Date: Dec. 13, 2016

(87) PCT Pub. No.: WO2015/192654
PCT Pub. Date: Dec. 23, 2015

(65) Prior Publication Data
US 2017/0121463 A1    May 4, 2017

(30) Foreign Application Priority Data
Jun. 17, 2014    (CN) .......................... 2014 1 0270638

(51) Int. Cl.
*C08G 77/20*    (2006.01)
*H01L 33/56*    (2010.01)
(Continued)

(52) U.S. Cl.
CPC ............ *C08G 77/20* (2013.01); *C08G 77/12* (2013.01); *H01L 33/483* (2013.01); *H01L 33/56* (2013.01); *H01L 33/486* (2013.01)

(58) Field of Classification Search
None
See application file for complete search history.

(56) References Cited

U.S. PATENT DOCUMENTS 7,282,270 B2    10/2007  Morita et al.
7,625,986 B2 *  12/2009  Yoshitake ............... C08L 83/04
                                                         525/478
(Continued)

FOREIGN PATENT DOCUMENTS

CN    102066493 A    5/2011
CN    103342816 A    10/2013
(Continued)

OTHER PUBLICATIONS

International Search Report (PCT/ISA/210) dated Apr. 24, 2015, by the Chinese Patent Office as the International Searching Authority for International Application No. PCT/CN2015/071379.

*Primary Examiner* — Robert S Loewe

(57) ABSTRACT

A curable organopolysiloxane composition and a semiconductor device are described. In a cured state and under conditions that the temperature is 25° C. and the humidity is 60% RH, the composition has the tensile strength of 2 to 8 Mpa, the elongation at break of 35% to 100% and the index of refraction being equal to or greater than 1.45. The composition includes: (A) organopolysiloxane comprising an $R^1{}_3SiO_{1/2}$ unit, an $R^2{}_2SiO_{2/2}$ unit and an $R^3SiO_{3/2}$ unit; (B) branched polyorganohydrogensiloxane having the viscosity of 300 to 4000 mPa·s, wherein each molecule has on average at least three silicon-bonded hydrogen atoms and at least one aromatic group, and the content of the aromatic (Continued)

group is larger than 10 mol %; and (C) a hydrosilylation catalyst having the content capable of facilitating curing of the composition.

11 Claims, 1 Drawing Sheet

(51) Int. Cl.
 *C08G 77/12* (2006.01)
 *H01L 33/48* (2010.01)

(56) References Cited

U.S. PATENT DOCUMENTS

| | | | |
|---|---|---|---|
| 7,863,392 B2* | 1/2011 | Nakanishi | C08L 83/04 523/107 |
| 8,299,186 B2 | 10/2012 | Sagawa et al. | |
| 2004/0116640 A1* | 6/2004 | Miyoshi | C08L 83/04 528/12 |
| 2004/0178509 A1* | 9/2004 | Yoshino | C08L 83/04 257/780 |
| 2005/0089696 A1 | 4/2005 | Bosshammer | |
| 2006/0264583 A1* | 11/2006 | Kashiwagi | C08L 83/04 525/478 |
| 2007/0244214 A1* | 10/2007 | Yoshitake | C08L 83/04 523/107 |
| 2008/0249259 A1* | 10/2008 | Kashiwagi | C08L 83/04 525/478 |
| 2010/0301377 A1* | 12/2010 | Kato | C08L 83/04 257/100 |
| 2011/0227235 A1* | 9/2011 | Yoshitake | C08L 83/04 257/791 |
| 2011/0254047 A1* | 10/2011 | Yoshitake | C08L 83/04 257/100 |
| 2011/0269918 A1* | 11/2011 | Hamamoto | H01L 33/56 525/478 |
| 2011/0309407 A1* | 12/2011 | Hamamoto | C08L 83/04 257/100 |
| 2011/0313123 A1* | 12/2011 | Kashiwagi | C08L 83/04 528/32 |
| 2012/0065343 A1* | 3/2012 | Bahadur | C08L 83/04 525/478 |
| 2012/0184663 A1* | 7/2012 | Hamamoto | C08L 83/04 524/500 |
| 2013/0161683 A1* | 6/2013 | Hamamoto | C08G 77/12 257/100 |
| 2013/0181361 A1* | 7/2013 | Uehara | C08L 83/08 257/788 |
| 2014/0194019 A1* | 7/2014 | Greer | C09J 183/04 442/150 |
| 2015/0329681 A1* | 11/2015 | Suto | C09D 183/04 528/31 |

FOREIGN PATENT DOCUMENTS

| | | |
|---|---|---|
| CN | 103571209 A | 2/2014 |
| WO | WO 2004/037927 A1 | 5/2004 |

* cited by examiner

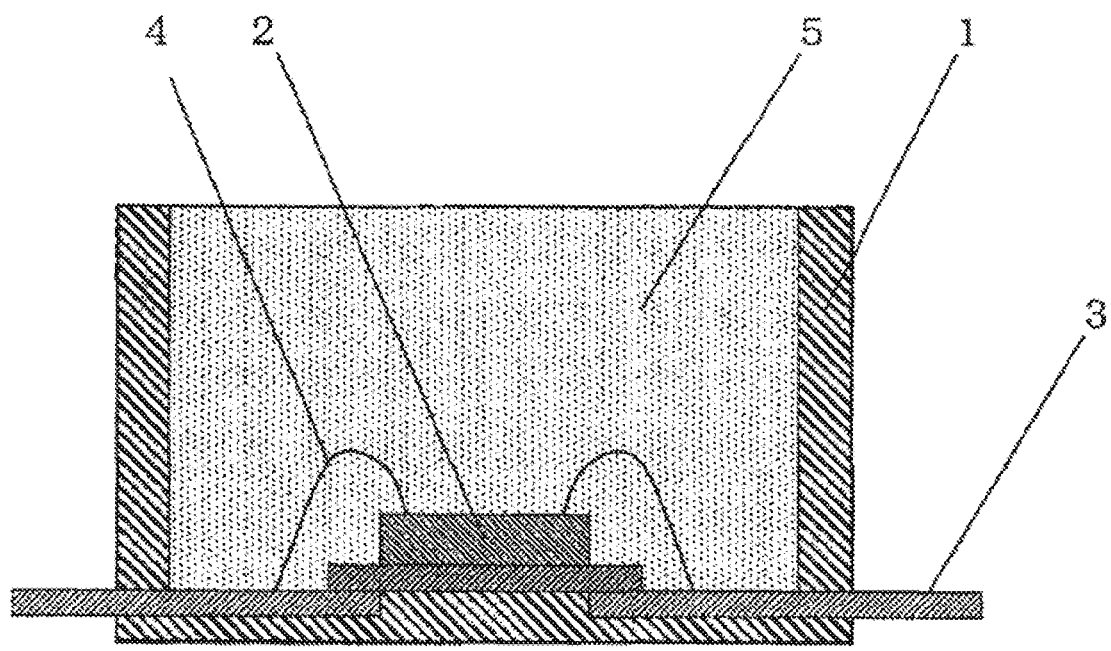

CURABLE ORGANOPOLYSILOXANE COMPOSITION AND SEMICONDUCTOR DEVICE

FIELD OF THE INVENTION

The present invention relates to a silicone composition and, more particularly, to a curable organopolysiloxane composition and a semiconductor device formed by curing the composition.

BACKGROUND OF THE INVENTION

A basic structural unit of a silicone polymer consists of silicon-oxygen chains, through silicon atoms, side chains are connected with other various organic groups. Compared with other polymer materials, the silicone polymer has the following outstanding properties: 1. Heat-resistance: a silicone product is constituted by a main chain of silicon oxygen (Si—O) bonds, therefore, silicone products have high temperature resistance, and the molecular bond will not break or decompose at a high temperature (or irradiation). 2. Weather resistance: the main chain of a silicone product consists of —Si—O—, which has better thermostability, radiation resistance, weather resistance and longer service life under natural environments. 3. Electrical insulation properties: a silicone product has good electrical insulation properties, its dielectric loss, withstand voltage, corona-resistance, volume resistivity and surface resistivity are all among the best in insulating materials, furthermore, its electrical performances are hardly effected by temperature and frequency. Thus, based on the aforementioned good properties, as a kind of silicone products, organopolysiloxane is widely used in LED photovoltaic industry.

CN103342816A describes a curable organopolysiloxane composition, which is used in LED lamp package and has the following advantages: excellent adhesion, high hardness, excellent thermal shock resistance, high transparency, etc.

Generally, a LED lamp package comprises a light-emitting component and a LED support, the light-emitting component is fixed on the LED support, the LED support is usually made of a metal substrate, the metal substrate is provided with a silver coating, and the silver coating is used for focusing or diffusing the light of the light-emitting component. By coating and curing the organopolysiloxane composition on the light-emitting component and the silver coating of the LED support, the packaging of LED lamp is basically completed. However, in the prior art, during the course of long-term use of the LED lamp package, sulfur in the ambient air will gradually erode to the silver coating, cause the silver coating to be vulcanized and tarnish, and further cause serious light attenuation; furthermore, in humid environments, the gradual penetration of moisture in the air can also cause problems of light-emitting components and seriously affect the lifetime of LED lamps.

SUMMARY OF THE INVENTION

A technical problem to be solved by the present invention is to provide a curable organopolysiloxane composition with prolonged vulcanization resistance time and excellent humidity resistance on the premise of maintaining high hardness and high index of refraction, so as to overcome the defects of poor vulcanization resistance and poor humidity resistance in the prior art.

To solve the above technical problems, the present invention also provides a semiconductor device comprising a light-emitting component and a support to fix the light-emitting component, wherein, the light-emitting component is coated with the cured substance of the curable organopolysiloxane composition of the present invention.

In a cured state and under conditions that the temperature is 25° C. and the humidity is 60% RH, the curable organopolysiloxane composition provided by the present invention has a tensile strength of 2 to 8 Mpa, an elongation at break of 35% to 100%, and an index of refraction being equal to or greater than 1.45. The composition comprises:

(A) organopolysiloxane comprising an $R^1_3SiO_{1/2}$ unit, an $R^2_2SiO_{2/2}$ unit and an $R^3SiO_{3/2}$ unit, wherein $R^1$ is selected from similar or different alkenyl groups, univalent substituted or unsubstituted hydrocarbonyls which do not contain any aromatic hydrocarbon and aliphatic unsaturated bond, $R^2$ is selected from similar or different alkenyl groups, aromatic groups, univalent substituted or unsubstituted hydrocarbonyls which do not contain any aromatic hydrocarbon and aliphatic unsaturated bond, and $R^3$ is an aromatic group; wherein the content of the aromatic group is larger than 10 mol % and the content of alkenyl groups is larger than 0.1 mol/100 g;

(B) branched polyorganohydrogensiloxane having the viscosity of 300 to 4000 mPa·s, wherein each molecule has on average at least three silicon-bonded hydrogen atoms and at least one aromatic group, and the content of the aromatic group is larger than 10 mol %;

(C) a hydrosilylation catalyst having the content capable of facilitating curing of the composition.

Wherein, the molecular structure of the component (A) is a branch structure. The alkenyl groups of the component (A) may represent vinyl, propenyl, butenyl, pentenyl and hexenyl, most preferably vinyl. The univalent substituted or unsubstituted hydrocarbonyls which do not contain any aromatic hydrocarbon and aliphatic unsaturated bond of the component (A) can comprise the following groups: methyl, ethyl, propyl, butyl, pentyl, hexyl, heptyl or other similar alkyls, chloromethane, 3-chloropropyl or other similar haloalkyls, most preferably methyl. The aromatic group in the component (A) can be phenyl, tolyl, xylyl, and naphthyl, and phenylethyl, phenylpropyl and other similar alkyl benzenes, and most preferably phenyl. In order to further improve the index of refraction of the cured body obtained from the composition of the present invention, the content of the aromatic group is preferably greater than 20 mol %. In order to further improve the reactiveness of the component (A) and component (B), the content of the alkenyl groups is preferably 0.1-0.4 mol/100 g; the viscosity of the component (A) of the present invention at 25° C. is not particularly limited, which can be can be 10-1000000 mPa·s, and preferably be 100-100000 mPa·s.

More preferably, the component (A) consists of the aforementioned $R^1_3SiO_{1/2}$ unit, the $R^2_2SiO_{2/2}$ unit and the $R^3SiO_{3/2}$ unit. As a preferred embodiment of the present invention, the component (A) has the following average unit formula:

$$(R^3SiO_{3/2})_{a1}(R^2_2SiO_{2/2})_{a2}(R^1_3SiO_{1/2})_{a3},$$

Wherein $R^1$ is selected from similar or different alkenyl groups, univalent substituted or unsubstituted alkyl, $R^2$ is selected from similar or different alkenyl groups, alkyl and aromatic groups that are univalent substituted or unsubstituted, $R^3$ is an aromatic group. Wherein $0.1<a1<0.8$, $0.1<a2<0.6$, $0.02<a3<0.5$, and $a1+a2+a3=1$. The alkenyl groups in $R^1$ may represent vinyl, propenyl, butenyl, pentenyl and hexenyl, and most preferably vinyl. The univalent substituted or unsubstituted alkyl in $R^1$ can comprise the following groups: methyl, ethyl, propyl, butyl, pentyl, hexyl, heptyl or other similar alkyls, and most preferably methyl.

The aromatic group in $R^1$ may represent phenyl, tolyl, xylyl and naphthyl, and phenylethyl, phenylpropyl and other similar alkyl benzenes, and most preferably phenyl.

The component (A) further preferably has the following average unit formula:

$$(R^3SiO_{3/2})_{a1}(R^{21}_2SiO_{2/2})_{a21}(R^{21}R^{22}SiO_{2/2})_{a22}(R^1_3SiO_{1/2})_{a3},$$

Wherein $R^1$ is selected from the aforementioned similar or different alkenyl groups, univalent substituted or unsubstituted alkyl, $R^{21}$ is a phenyl, and $R^{22}$ is a univalent substituted or unsubstituted alkyl, which comprises the following groups: methyl, ethyl, propyl, butyl, pentyl, hexyl, heptyl or other alkyl alike, and most preferably methyl. $R^3$ is the aforementioned aromatic group, which can be phenyl, tolyl, xylyl and naphthyl, phenylethyl, phenylpropyl and the like, and most preferably phenyl. $0.1<a1<0.8$, $0.1<a21<0.4$, $0<a22<0.2$, $0.02<a3<0.5$, $a1+a21+a22+a3=1$.

The component (B) is a branched polyorganohydrogensiloxane, of which the molecular structure is a branched structure. The component (B) works as a cross-linking agent, in the present invention, the SiH of the branched structure component (B) and the alkenyl group of the branching structure component (A) generate an addition reaction (hydrosilylation) and form a cross-linked network structure. The molar ratio of silicon-bonded hydrogen atoms in the component (B) to the alkenyl groups in the component (A) is 0.9-2.0. The component (B) has a viscosity of 300 to 4000 mPa·s, within the viscosity range, the composition of the component (B) and other components of the present invention has a prolonged vulcanization resistance time and excellent humidity resistance after curing, and more preferably, the component (B) has a viscosity of 1000 to 3000 mPa·s. The component (B) comprises an $R^4_3SiO_{1/2}$ unit and an $R^5SiO_{3/2}$ unit, wherein $R^4$ is selected from similar or different univalent substituted or unsubstituted hydrocarbyl and hydrogen atoms, which do not contain any aromatic hydrocarbon and aliphatic unsaturated bond, and $R^5$ is aromatic group. The univalent substituted or unsubstituted hydrocarbonyl which do not contain any aromatic hydrocarbon and aliphatic unsaturated bond of the component (B) can comprise the following groups: methyl, ethyl, propyl, butyl, pentyl, hexyl, heptyl or other alkyl alike, chloromethane, 3-chloropropyl and other similar haloalkyl, most preferably methyl. The aromatic group in the component (B) can be phenyl, tolyl, xylyl and naphthyl, and phenylethyl, phenylpropyl and other similar alkyl benzenes, and most preferably phenyl. The present invention has no special restrictions to the content ratio of the component (A) to the component (B), the weight ratio of the component (A) to the component (B) may range from 1:99 to 99:1, more preferably, from 20:80 to 80:20. As both the component (A) and the component (B) are similar branched structures, composition formed by any weight ratio may have similar properties, as long as the silicon-bonded hydrogen atoms in the component (B) and the alkenyl groups in the component (A) generate a sufficient reaction, for example, the molar ratio of silicon-bonded hydrogen atoms in the component (B) to the alkenyl groups in the component (A) is preferably 0.9-2.0.

More preferably, the component (B) consists of the aforementioned $R^4_3SiO_{1/2}$ unit and $R^5SiO_{3/2}$ unit. As a preferred embodiment of the present invention, the component (B) has the following average unit formula:

$$(R^5SiO_{3/2})_{b1}(R^4_3SiO_{1/2})_{b3},$$

Wherein $R^4$ is selected from the aforementioned similar or different alkyl groups, hydroxy and hydrogen atoms, which are univalent substituted or unsubstituted, $R^5$ is the aforementioned aromatic group, which can be phenyl, tolyl, xylyl and naphthyl, and phenylethyl, phenylpropyl and other similar alkyl benzenes, and most preferably phenyl; wherein $0.5<b1<0.9$, $0.1<b3<0.5$, $b1+b3=1$.

The component (B) further preferably has the following average unit formula, $$(R^5SiO_{3/2})_{b1}(R^4_3SiO_{1/2})_{b31}(R^4_2HSiO_{1/2})_{b32},$$

Wherein $R^4$ is a univalent substituted or unsubstituted alkyl, which can comprise the following groups: methyl, ethyl, propyl, butyl, pentyl, hexyl, heptyl or other similar alkyls, chloromethane, 3-chloropropyl and other similar haloalkyls, most preferably methyl; $R^5$ is a phenyl; wherein $0.5<b1<0.9$, $0.1<b31<0.4$, $0.1<b32<0.5$, and $b1+b31+b32=1$.

The composition of the present invention may further comprises component (A'), the component (A') comprises $R^1_3SiO_{1/2}$ units and the $R^3SiO_{3/2}$ units, $R^1$ is selected from similar or different alkenyl groups, univalent substituted or unsubstituted hydrocarbonyls which do not contain any aromatic hydrocarbon and aliphatic unsaturated bond, and $R^3$ is an aromatic group; wherein the content of the aromatic group is larger than 10 mol % and the content of alkenyl groups is larger than 0.1 mol/100 g. Wherein the alkenyl groups, univalent substituted or unsubstituted hydrocarbonyl which do not contain any aromatic hydrocarbon and aliphatic unsaturated bond, and hydroxy and aromatic groups are as defined above. The component (A) has a viscosity that is less than 15000 mPa·s at 25° C., and component (A') has a viscosity that is more than 15000 mPa·s at 25° C., the weight ratio of the component (A') to the component (A) is 100:(20-500).

More preferably, the component (A') consists of the $R^1_3SiO_{1/2}$ units and the $R^3SiO_{3/2}$ units. As a preferred embodiment of the present invention, the component (A') has the following average unit formula:

$$(R^3SiO_{3/2})_{a'1}(R^1_3SiO_{1/2})_{a'3},$$

Wherein $R^1$ is selected from similar or different alkenyl groups, and univalent substituted or unsubstituted alkyls and hydroxyls, and $R^3$ is an aromatic group, wherein $0.1<a'1<0.9$, $0.1<a'3<0.9$, and $a'1+a'3=1$.

In the present invention, the component (C) acts as a catalyst to facilitate the hydrosilylation reaction between alkenyl groups of the component (A) and (A') and silicon-bonded hydrogen atoms of the component (B). In other words, the component (C) is a catalyst that promotes curing of the composition. Wherein, the present invention has no special limit to the kind of catalysts, all catalysts that are commonly used in this field, such as platinum catalyst, rhodium catalyst or palladium catalyst may be used, and platinum catalyst is preferred in the present invention. Specific examples include platinum black, chloroplatinic acid, alcohol solutions of chloroplatinic acid, platinum-alkenylsiloxane complexes, platinum-olefin complexes, etc., preferably platinum-alkenylsiloxane complexes. The present invention employs a platinum catalyst having tetramethyl-vinyldisiloxane as a ligand. There is no special restriction to the content of the component (C), as long as the content is enough to facilitate the curing reaction of the composition.

The curable organopolysiloxane composition of the present invention further comprises a component (D) as an inhibitor of the addition reaction, which prolongs the shelf life of the curable organopolysiloxane composition of the present invention. The inhibitor of the addition reaction is a temperature-dependent substance, which loses its inhibitory effect rapidly when being heated to a certain extent, so that the composition generates a curing reaction. There is no special restriction to the kind, weight and content of the component (D), inhibitors commonly used in the art can be used, and can be added by an amount as required. For example, the component (D) of the present invention is ethynylcyclohexanol, and the addition amount thereof is 0.05% by weight of the total content of the components (A) and (B).

There is no special restriction to the preparation method of the components (A)-(C) in the present invention, the components can be obtained by preparation methods commonly used in the art or by commercial purchases.

In the present invention, the curable organopolysiloxane composition can be prepared by mixing the necessary components (A)-(C), and adding the component (A'), (D) and other addictives such as inorganic fillers, pigments, flame retardants, heat-resistant agents and the like as required. The present invention provides a semiconductor device comprising a light-emitting component and a support configured to fix the light-emitting component, the aforementioned mixed composition is coated on the surface of the support for the light-emitting component and cured. The curing time or temperature may vary, for example, the first cure is carried out at 100° C.-150° C. for 0.5-2 h, and then the second cure is carried out at 150° C.-200° C. for 2-4 h. A cured body that is formed at a temperature of 25° C. and a humidity of 60% RH has a tensile strength of 2-8 Mpa, an elongation at break of 35%-100%, and an index of refraction equal to or more than 1.45, preferably more than 1.5. In contrast, it is difficult for a conventional organopolysiloxane composition to form a cured body that has the aforesaid good properties in tensile strength, elongation at break and index of refraction, and further has the advantages of a prolonged vulcanization resistance time and excellent humidity resistance.

A measuring method for a tensile strength and an elongation at break is that: the obtained composition is defoamed and made into a sheet with a thickness of 2 mm; the sheet is held at 100° C. for 1 h, and then cured at 150° C. for 3 h; the sheet is the processed into a dumbbell-shape, and the tensile strength and elongation at break thereof are measured at 25° C. and 60% RH by a universal materials tester.

The present invention has the following beneficial effects: compared with the prior art, the curable organopolysiloxane composition and its cured semiconductor device of the present invention not only maintain good thermal shock resistance, high index of refraction and high hardness, but also have a prolonged vulcanization resistance time and excellent humidity resistance.

BRIEF DESCRIPTION OF THE DRAWINGS

FIG. 1 is a cross-sectional schematic view of a packaged semiconductor unit provided by an embodiment of the present invention;

The reference signs in the drawings are as follows:
1-LED support; 2-light-emitting component; 3-electrode; 4-wire; 5-cured body of a curable organopolysiloxane composition.

DETAILED DESCRIPTION OF THE PREFERRED EMBODIMENT

In order to make the purposes, technical solutions, and advantages of the present invention be clearer, the present invention will be further described in detail hereinafter with reference to accompany embodiments. It should be understood that the specific embodiments described here are only intended to illustrate the present invention, but not to limit the present invention.

Synthesis Example 1

Phenyltrimethoxysilane (68.3 g) is added into a flask, deionized water (15 g) and concentrated hydrochloric acid having a concentration of 37% by mass (15 g) are added successively, and a reaction is performed at 70° C. for 5 min; dimethoxymethylphenylsilane (12.0 g) and diphenyldimethoxysilane (9.3 g) are added quickly, and refluxing is performed at 70° C. for 60 min; divinyltetramethyldisiloxane (14.0 g) is added and refluxing is further performed for 60 min. The reactants are transferred into a separatory funnel, an acid layer is removed, the organic layer is washed with water to a neutral pH, and then transferred to a flask; deionized water (1 g) is added, refluxing is performed at 70° C. for 60 min, and a concentration by distillation under reduced pressure is performed by a vacuum pump. Solvent and substances with low boiling point are removed by reducing the pressure, such that the resin with the following structure is obtained:

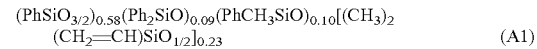

$(PhSiO_{3/2})_{0.58}(Ph_2SiO)_{0.09}(PhCH_3SiO)_{0.10}[(CH_3)_2(CH_2=CH)SiO_{1/2}]_{0.23}$ (A1)

The product is a silicone polysiloxane having a viscosity of 10000 mPa·s at 25° C., which is an organic silicon resin with a benzene content of 40% and a vinyl content of 0.25 mol/100 g.

Synthesis Example 2

Phenyltrimethoxysilane (70.4 g) is added into a flask, deionized water (15 g) and concentrated hydrochloric acid having a concentration of 37% by mass (15 g) are added successively, diphenyldimethoxysilane (15.6 g) is added quickly, and refluxing is performed at 70° C. for 60 min; divinyltetramethyldisiloxane (13.8 g) is added and refluxing is performed for 60 min. The reactants are transferred into a separatory funnel, an acid layer is removed, the organic layer is washed with water to a neutral pH, and then transferred to a flask; deionized water (1 g) is added, refluxing is performed at 70° C. for 60 min, and a concentration by distillation under reduced pressure is performed by a vacuum pump. Solvent and substances with low boiling point are removed by reducing the pressure, such that the resin with the following structure is obtained:

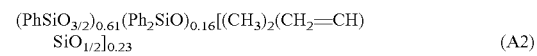

$(PhSiO_{3/2})_{0.61}(Ph_2SiO)_{0.16}[(CH_3)_2(CH_2=CH)SiO_{1/2}]_{0.23}$ (A2)

The product is a silicone polysiloxane with a benzene content of 45% and a vinyl content of 0.25 mol/100 g, and has a viscosity of 11000 mPa·s at 25° C.

Synthesis Example 3

Phenyltrimethoxysilane (77.3 g) is added into a flask, deionized water (15 g) and concentrated hydrochloric acid having a concentration of 37% by mass (15 g) are added successively, and a reaction is performed at 70° C. for 5 min; divinyltetramethyldisiloxane (10 g) and hexamethyldisiloxane (10 g) are added and refluxing is performed for 60 min. The reactants are transferred into a separatory funnel, an acid layer is removed, the organic layer is washed with water to a neutral pH, and then transferred to a flask; deionized water (1 g) is added, refluxing is performed at 70° C. for 60 min, and a concentration by distillation under reduced pressure is performed by a vacuum pump. Solvent and substances with low boiling point are removed by reducing the pressure, such that the resin with the following structure is obtained:

$$(PhSiO_{3/2})_{0.76}[(CH_3)_3SiO_{1/2}]_{0.10}[(CH_3)_2(CH_2\!\!=\!\!CH)SiO_{1/2}]_{0.14} \quad (A')$$

The product is a silicone polysiloxane with a benzene content of 40% and a vinyl content of 0.15 mol/100 g, and has a viscosity of 20000 mPa·s at 25° C.

Synthesis Example 4

Phenyltrimethoxysilane (60.3 g) is added into a flask, deionized water (15 g) and concentrated hydrochloric acid having a concentration of 37% by mass (15 g) are added successively, and a reaction is performed at 70° C. for 5 min; tetramethyldisiloxane (15 g) and hexamethyldisiloxane (12 g) are added and refluxing is performed for 180 min. The reactants are transferred into a separatory funnel, an acid layer is removed, the organic layer is washed with water to a neutral pH, and then transferred to a flask; deionized water (1 g) is added, refluxing is performed at 70° C. for 60 min, and a concentration by distillation under reduced pressure is performed by a vacuum pump. Solvent and substances with low boiling point are removed by reducing the pressure, such that resin with the following structure is obtained:

$$(PhSiO_{3/2})_{0.53}[(CH_3)_3SiO_{1/2}]_{0.16}[(CH_3)_2HSiO_{1/2}]_{0.31} \quad (B1)$$

The product is an organosilicon compound with a benzene content of 30% and a hydrogen content of 0.37 mol/100 g, and has a viscosity of 4000 mPa·s at 25° C.

Synthesis Example 5

Phenyltrimethoxysilane (55.3 g) is added into a flask, deionized water (15 g) and concentrated hydrochloric acid having a concentration of 37% by mass (15 g) are added successively, and a reaction is performed at 70° C. for 5 min; tetramethyldisiloxane (16.2 g) and hexamethyldisiloxane (14.4 g) are added and refluxing is performed for 60 min. The reactants are transferred into a separatory funnel, an acid layer is removed, the organic layer is washed with water to a neutral pH, and then transferred to a flask; deionized water (1 g) is added, refluxing is performed at 70° C. for 60 min, and a concentration by distillation under reduced pressure is performed by a vacuum pump. Solvent and substances with low boiling point are removed under reduced pressure, such that the resin with the following structure is obtained:

$$(PhSiO_{3/2})_{0.49}[(CH_3)_3SiO_{1/2}]_{0.22}[(CH_3)_2HSiO_{1/2}]_{0.29} \quad (B2)$$

The product is an organosilicon compound with a benzene content of 30% and a hydrogen content of 0.35 mol/100 g, and has a viscosity of 300 mPa·s at 25° C.

Synthesis Example 6

Phenyltrimethoxysilane (57.1 g) is added into a flask, deionized water (15 g) and concentrated hydrochloric acid having a concentration of 37% by mass (15 g) are added successively, and a reaction is performed at 70° C. for 5 min; tetramethyldisiloxane (15.6 g) and hexamethyldisiloxane (13.6 g) are added and refluxing is performed for 120 min. The reactants are transferred into a separatory funnel, an acid layer is removed, the organic layer is washed with water to a neutral pH, and then transferred to a flask; deionized water (1 g) is added, refluxing is performed at 70° C. for 60 min, and a concentration by distillation under reduced pressure is performed by a vacuum pump. Solvent and substances with low boiling point are removed under reduced pressure, such that the resin with the following structure is obtained:

$$(PhSiO_{3/2})_{0.50}[(CH_3)_3SiO_{1/2}]_{0.23}[(CH_3)_2HSiO_{1/2}]_{0.29} \quad (B3)$$

The product is an organosilicon compound with a benzene content of 30% and a hydrogen content of 0.35 mol/100 g, and has a viscosity of 2000 mPa·s at 25° C.

Synthesis Example 7

Phenyltrimethoxysilane (75.3 g) is added into a flask, deionized water (15 g) and concentrated hydrochloric acid having a concentration of 37% by mass (15 g) are added successively, and a reaction is performed at 70° C. for 5 min; tetramethyldisiloxane (14.2 g) and hexamethyldisiloxane (12.4 g) are added and refluxing is performed for 300 min. The reactants are transferred into a separatory funnel, an acid layer is removed, the organic layer is washed with water to a neutral pH, and then transferred to a flask; deionized water (1 g) is added, refluxing is performed at 70° C. for 60 min, and a concentration by distillation under reduced pressure is performed by a vacuum pump. Solvent and substances with low boiling point are removed under reduced pressure, such that the resin with the following structure is obtained:

$$(PhSiO_{3/2})_{0.56}[(CH_3)_3SiO_{1/2}]_{0.16}[(CH_3)_2HSiO_{1/2}]_{0.28} \quad (B4)$$

The product is an organosilicon compound with a benzene content of 30% and a hydrogen content of 0.34 mol/100 g, and has a viscosity of 5000 mPa·s at 25'C.

Synthesis Example 8

Phenyltrimethoxysilane (49.5 g) is added into a flask, deionized water (I 5 g) and concentrated hydrochloric acid having a concentration of 37% by mass (15 g) are added successively, and a reaction is performed at 70° C. for 5 min; tetramethyldisiloxane (16.4 g) and hexamethyldisiloxane (14.1 g) are added and refluxing is performed for 60 min. The reactants are transferred into a separatory funnel, an acid layer is removed, the organic layer is washed with water to a neutral pH, and then transferred to a flask; deionized water (1 g) is added, refluxing is performed at 70° C. for 60 min, and a concentration by distillation under reduced pressure is performed by a vacuum pump. Solvent and substances with low boiling point are removed under reduced pressure, such that the resin with the following structure is obtained:

$$(PhSiO_{3/2})_{0.48}[(CH_3)_3SiO_{1/2}]_{0.21}[(CH_3)_2HSiO_{1/2}]_{0.31} \quad (B5)$$

The product is an organosilicon compound with a benzene content of 30% and a hydrogen content of 0.39 mol/100 g, and has a viscosity of 100 mPa·s at 25° C.

Practical Examples 1-8

The resins (A) and (B) prepared by the synthesis example 1-8, a catalyst for the addition reaction (C): chloroplatinic acid in octanol solution (a platinum concentration of 5 wt. %), and (D) a inhibitor: 2-Phenyl-3-butyn-2-ol are mixed according to the combination as shown in Table 1 (all components are calculated by mass), and the compositions of the present invention are obtained.

The semiconductor device LED light shown in FIG. 1 is packaged in the following manner: a LED support 1 to which a light-emitting component 2 is fixed is provided, wherein the light-emitting component 2 is connected with a electrode 3 by a wire 4 (usually a gold wire), then the aforementioned curable organopolysiloxane composition 5 of the present invention is coated on the LED support 1 to which a light-emitting component 2 is fixed.

The physical and chemical properties of the obtained compositions are measured by the following means, and the results are recorded in Table 1.

Hardness

The obtained composition is defoamed and 10 g of the defoamed composition is kept at 100° C. for 1 h, and then cured at 150° C. for 3 h; at 25° C. and 60% RH, the hardness thereof is measured at three points using a Shore D hardness tester, and the average value is recorded.

Index of Refraction

The cured organopolysiloxane is measured at 25° C. by an Abbe refractometer, and the light source utilizes a visible light of 589 nm.

Tensile Strength and Elongation at Break

The obtained composition is defoamed and made into a sheet with a thickness of 2 mm, which is held at 100° C. for 1 h and then cured at 150° C. for 3 h; the sheet is then processed into a dumbbell-shape, and the tensile strength and elongation at break are measured at 25° C. and 60% RH by a universal materials tester.

Vulcanization Resistance

The obtained composition is defoamed and dispensed on Enrui type 5050 support (without chip gold wire) which has been dehumidified at 150° C. for 2 h, the dispensed composition is held at 100° C. for 1 h and then cured at 150° C. for 3 h. The support is hung in a 250 ml reagent bottle receiving 2 g powdered sulfur and baked at 90° C., whether a silver coating layer on the support tarnishes is observed, and the time when the silver coating of the support is tarnished is recorded.

Moisture Proof of 5050 White Light SMD (Monochromatic Light)

The obtained composition is defoamed and dispensed on Enrui type 5050 support (without chip gold wire) which has been dehumidified at 150° C. for 2 h, the dispensed composition is held at 100° C. for 1 h, and then cured at 150° C. for 3 h. A lamp bead is placed at 60° C. and 60% RH for 52 h, then removed and placed for 15-30 min, and reflowed with the highest temperature of 270° C. over five temperature zones for three times; whether there is a dead lamp status is observed.

TABLE 1

| Parts by mass | | Practical Example 1 | Practical Example 2 | Practical Example 3 | Practical Example 4 | Practical Example 5 | Practical Example 6 | Practical Example 7 | Practical Example 8 |
|---|---|---|---|---|---|---|---|---|---|
| Synthesis Example 1 | A1 | 48 | | 43 | 40 | 57 | 42 | 43 | 48 |
| Synthesis Example 2 | A2 | | 48 | | | | | | |
| Synthesis Example 3 | A' | 12 | 12 | 17 | 20 | 0 | 12 | 17 | 12 |
| Synthesis Example 4 | B1 | 39.85 | 39.85 | | | 42.85 | | | |
| Synthesis Example 5 | B2 | | | 39.85 | | | | | |
| Synthesis Example 6 | B3 | | | | 39.85 | | 45.85 | | |
| Synthesis Example 7 | B4 | | | | | | | 39.85 | |
| Synthesis Example 8 | B5 | | | | | | | | 39.85 |
| | C | 0.1 | 0.1 | 0.1 | 0.1 | 0.1 | 0.1 | 0.1 | 0.1 |
| | D | 0.05 | 0.05 | 0.05 | 0.05 | 0.05 | 0.05 | 0.05 | 0.05 |
| Si—H/Si-Vi (molar ratio) | | 1.08 | 1.08 | 1.08 | 1.08 | 1.08 | 1.08 | 1.08 | 1.08 |
| Evaluation Results | | | | | | | | | |
| Hardness (25° C.) | | D50 | D52 | D35 | D45 | D30 | D38 | D55 | D25 |
| Index of Refraction | | 1.53 | 1.53 | 1.53 | 1.53 | 1.53 | 1.53 | 1.53 | 1.53 |
| Tensile strength Mpa | | 4 | 3.8 | 2.5 | 3.0 | 2.2 | 2.8 | 5 | 0.9 |
| Elongation at break % | | 40 | 42 | 55 | 50 | 60 | 52 | 15 | 60 |
| Vulcanization resistance time | | 5 h | 5 h | 5 h | 5 h | 5 h | 5 h | 4 h | 2 h |
| 5050 white light support moisture resistance test | | ✓ | ✓ | ✓ | ✓ | ✓ | ✓ | ✓ | ✓ |

As can be seen from the results in Table 1, by the present invention, by combining the component (A) comprising a branched structure, in particular, comprising $R1_3SiO_{1/2}$ unit, $R^2_2SiO_{2/2}$ unit and $R3SiO_{3/2}$ unit, with the component (B) comprising a branched structure and has a viscosity of 300-4000 mPa·s, a composition is obtained; the composition has high hardness after heating curing, further has a prolonged vulcanization resistance time and excellent humidity resistance, and can be applied in a 5050 white light support in LED package. It can be seen from Table 1 that, compared with the embodiments of which the component (B) has a viscosity outside the range of 300-4000 mPa·s, and a tensile strength and an elongation at break that are not greater than 2 Mpa and 40% respectively, the embodiments of which component (B) has a viscosity of 300-4000 mPa·s, a tensile strength higher than 2 Mpa, and an elongation at break higher than 40% possesses outstanding advantageous performances in both the vulcanization resistance time and the humidity resistance.

The above contents are only preferred embodiments of the present invention, and are not intended to limit the present invention. Any modification, equivalent replacement or improvement made within the spirit and principle of the present invention should be included in the protection scope of the present invention.

What is claimed is:

1. A curable organopolysiloxane composition, wherein, in its cured state and under conditions that the temperature is 25° C. and the humidity is 60% RH, the composition has a tensile strength of 2 to 8 Mpa, an elongation at break of 35% to 100%, and an index of refraction being equal to or greater than 1.45, the composition comprises:
   (A) organopolysiloxane comprising an $R^1_3SiO_{1/2}$ unit, an $R^2_2SiO_{2/2}$ unit and an $R^3SiO_{3/2}$ unit, wherein $R^1$ is selected from similar or different alkenyl groups, univalent substituted or unsubstituted hydrocarbonyls which do not contain any aromatic hydrocarbon and aliphatic unsaturated bond, $R^2$ is selected from similar or different alkenyl groups, aromatic groups, univalent substituted or unsubstituted hydrocarbonyls which do not contain any aromatic hydrocarbon and aliphatic unsaturated bond, and $R^3$ is an aromatic group; wherein the content of the aromatic group is larger than 10 mol % and the content of alkenyl groups is larger than 0.1 mol/100 g;
   (B) branched polyorganohydrogensiloxane having the viscosity of 300 to 4000 mPa·s, wherein each molecule has on average at least three silicon-bonded hydrogen atoms and at least one aromatic group, and the content of the aromatic group is larger than 10 mol %;
   (C) a hydrosilylation catalyst having the content capable of facilitating curing of the composition.

2. The curable organopolysiloxane composition according to claim 1, wherein, the component (B) comprising $R^4_3SiO_{1/2}$ unit, an $R^5SiO_{3/2}$ unit, wherein, $R^4$ is selected from similar or different univalent substituted or unsubstituted hydrocarbyl and hydrogen atoms, which do not contain any aromatic hydrocarbon and aliphatic unsaturated bond, and $R^5$ is an aromatic group.

3. The curable organopolysiloxane composition according to claim 2, wherein the component (B) has the following average unit formula, $(R^5SiO_{3/2})_{b1}(R^4_3SiO_{1/2})_{b3}$, Wherein $R^4$ is selected from similar or different alkyl groups and hydrogen atoms, which are univalent substituted or unsubstituted, $R^5$ is an aromatic group, wherein, $0.5<b1<0.9$, $0.1<b3<0.5$, $b1+b3=1$.

4. The curable organopolysiloxane composition according to claim 2, wherein, the component (B) has the following average unit formula, $(R^5SiO_{3/2})_{b1}(R^4_3SiO_{1/2})_{b31}(R^4_2HSiO_{1/2})_{b32}$, Wherein $R^4$ is s univalent substituted or unsubstituted alkyl, $R^5$ is a phenyl, wherein, $0.5<b1<0.9$, $0.1<b31<0.4$, $0.1<b32<0.5$, and $b1+b31+b32=1$.

5. The curable organopolysiloxane composition according to claim 1, wherein, the composition further comprising component (A'), the component (A') comprises $R^1_3SiO_{1/2}$ unit and the $R^3SiO_{3/2}$ unit, $R^1$ is selected from similar or different alkenyl groups, univalent substituted or unsubstituted hydrocarbonyls which do not contain any aromatic hydrocarbon and aliphatic unsaturated bond, and $R^3$ is an aromatic group; wherein the content of the aromatic group is larger than 10 mol % and the content of alkenyl groups is larger than 0.1 mol/100 g, wherein component (A) has a viscosity that is less than 15000 mPa·s at 25° C., and component (A') has a viscosity that is more than 15000 mPas at 25° C., the weight ratio of the component (A') to the component (A) is 100: (20-500).

6. The curable organopolysiloxane composition according to claim 5, wherein, the component (A') has the following average unit formula, $(R^3SiO_{3/2})_{a'1}(R^1_3SiO_{1/2})_{a'3}$, Wherein $R^1$ is selected from similar or different alkenyl groups, univalent substituted or unsubstituted alkyl, $R^3$ is an aromatic group, wherein, $0.1<a1<0.9$, $0.1<a'3<0.9$, and $a'1+a'3=1$.

7. The curable organopolysiloxane composition according to claim 1, wherein, the molar ratio of the silicon-bonded hydrogen atoms in the component (B) to the alkenyl groups in the component (A) is 0.9-2.0.

8. The curable organopolysiloxane composition according to claim 1, wherein, the weight ratio of the component (A) to the component (B) range from 1:99 to 99:1.

9. The curable organopolysiloxane composition according to claim 1, wherein, the component (A) has the following average unit formula, $(R^3SiO_{3/2})_{a1}(R^2_2SiO_{2/2})_{a2}(R^1_3SiO_{1/2})_{a3}$, Wherein $R^1$ is selected from similar or different alkenyl groups, univalent substituted or unsubstituted alkyl, $R^2$ is selected from similar or different alkenyl groups, alkyl and aromatic groups that are univalent substituted or unsubstituted, $R^3$ is an aromatic group, wherein $0.1<a1<0.8$, $0.1<a2<0.6$, $0.02<a3<0.5$, $a1+a2+a3=1$.

10. The curable organopolysiloxane composition according to claim 1, wherein, the component (A) has the following average unit formula, $(R^3SiO_{3/2})_{a1}(R^{21}_2SiO_{2/2})_{a21}(R^{21}R^{22}SiO_{2/2})_{a22}(R^1_3SiO_{1/2})_{a3}$, Wherein $R^1$ is selected from similar or different alkenyl groups, univalent substituted or unsubstituted alkyl, $R^{21}$ is a phenyl, and $R^{22}$ is a univalent substituted or unsubstituted alkyl, $R^3$ is an aromatic group, wherein, $0.1<a1<0.8$, $0.1<a21<0.4$, $0<a22<0.2$, $0.02<a3<0.5$, $a1+a21+a22+a3=1$.

11. A semiconductor device comprising a light-emitting component and a support configured to fix the light-emitting component, wherein, the light-emitting component is coated with the cured substance of the curable organopolysiloxane composition of claim 1.

* * * * *